United States Patent
Lee et al.

(10) Patent No.: US 9,911,556 B2
(45) Date of Patent: Mar. 6, 2018

(54) CONTROL KNOB HAVING IMAGE OUTPUT PART

(71) Applicant: KORTEK CORPORATION, Incheon (KR)

(72) Inventors: Kyoung Chan Lee, Seoul (KR); Hong Jin Jeon, Goyang-si (KR)

(73) Assignee: KORTEK CORPORATION (KR)

( * ) Notice: Subject to any disclaimer, the term of this patent is extended or adjusted under 35 U.S.C. 154(b) by 54 days.

(21) Appl. No.: 14/911,751

(22) PCT Filed: Sep. 5, 2014

(86) PCT No.: PCT/KR2014/008363
§ 371 (c)(1),
(2) Date: Feb. 12, 2016

(87) PCT Pub. No.: WO2015/041426
PCT Pub. Date: Mar. 26, 2015

(65) Prior Publication Data
US 2016/0189896 A1    Jun. 30, 2016

(30) Foreign Application Priority Data
Sep. 17, 2013   (KR) .................. 10-2013-0112102

(51) Int. Cl.
*H01H 15/10* (2006.01)
*H01H 9/00* (2006.01)
(Continued)

(52) U.S. Cl.
CPC ............ *H01H 25/06* (2013.01); *H01H 9/181* (2013.01); *H01H 19/025* (2013.01);
(Continued)

(58) Field of Classification Search
CPC ...... H01H 25/06; H01H 19/025; H01H 9/181; H01H 2219/066; H01H 2219/06; H03K 17/968; H03K 17/97
(Continued)

(56) References Cited

U.S. PATENT DOCUMENTS 6,222,525 B1    4/2001  Armstrong
2006/0260925 A1*  11/2006  Niiyama ............. H01H 25/002
                                                          200/547
(Continued)

FOREIGN PATENT DOCUMENTS

EP          2447971 A1     5/2012
KR       10-0645246        11/2006
(Continued)

OTHER PUBLICATIONS

International Search Report; PCT/KR2014/008363; dated Sep. 5, 2014; 2 pgs.
European Extended Search Report for Application No. 14846149.4; 8 pgs.

*Primary Examiner* — Edwin A. Leon
*Assistant Examiner* — Lheiren Mae A Caroc
(74) *Attorney, Agent, or Firm* — Schmeiser, Olsen & Watts, LLP

(57) ABSTRACT

A control knob having an image output part is provided. The control knob having an image output part of the present invention includes: a head part through which an image is output; a body part into which a portion of the head part is inserted; a guide part which is provided inside the body part and coupled to the head part so as to guide the horizontal movement of the head part; and a returning part which is connected to the head part with the guide part and guides the head part horizontally moved along the guide part to the central portion of the body part.

11 Claims, 10 Drawing Sheets

(51) Int. Cl.
*H01H 25/06* (2006.01)
*H01H 9/18* (2006.01)
*H01H 19/02* (2006.01)
*H03K 17/968* (2006.01)
*H03K 17/97* (2006.01)

(52) U.S. Cl.
CPC ........... *H03K 17/968* (2013.01); *H03K 17/97* (2013.01); *H01H 2219/06* (2013.01); *H01H 2219/066* (2013.01); *H03K 2217/94057* (2013.01)

(58) Field of Classification Search
USPC ................................ 200/308, 310, 313, 316
See application file for complete search history.

(56) References Cited

U.S. PATENT DOCUMENTS

2010/0140059 A1   6/2010  Kagami et al.
2013/0220779 A1*  8/2013  Kerner ................... H01H 19/11
                                                        200/4

FOREIGN PATENT DOCUMENTS

| KR | 10-0994008 | 11/2010 |
| KR | 10-1096925 | 12/2011 |
| KR | 10-1155221 | 6/2012 |
| WO | WO2010000281 A1 | 1/2010 |

* cited by examiner

CONTROL KNOB HAVING IMAGE OUTPUT PART

CROSS-REFERENCE TO RELATED APPLICATIONS

This application claims priority to PCT Application No. PCT/KR2014/008363, having a filing date of Sep. 5, 2014, based on KR 10 2013 0112102, having a filing date of Sep. 17, 2013, the entire contents of which are hereby incorporated by reference.

FIELD OF TECHNOLOGY

The following relates to a control knob having an image output part, and more particularly, to a control knob having an image output part, which can permit input of manipulation force in various ways and can output an image therethrough.

BACKGROUND

Generally, upon receiving a manipulation signal from a user, a control knob can be rotated like a dial or can be pushed to convert rotational manipulation force into a control signal.

Installation of both a dial type switch and a laterally movable switch like a jog shuttle requires separate spaces for installation of the switches, thereby reducing space utility.

When the control knob is disposed together with an image output part, it is necessary to provide separate installation spaces for the control knob and the image output part, thereby reducing space utility.

The background technique of the present invention is disclosed in Korean Patent Publication No. 1997-0017747 A (Publication Date: 1997 Apr. 30, entitled "Input data control switch of microcomputer").

Technical Problem

In the related art, when a control knob configured to receive a manipulation signal and an image output part are disposed in the same space, there is difficulty in installation of the control knob and the image output part.

Further, when various control knobs operated in various ways are provided in order to receive manipulation signals provided in various ways, there are problems of deterioration in space utility and increase in installation cost. Therefore, there is a need to solve such problems in the related art.

Embodiments of the present invention have been conceived to solve such problems in the art, and it is an aspect of embodiments of the present invention to provide a control knob having an image output part, which can permit input of manipulation force in various ways and can output an image therethrough.

SUMMARY

An aspect relates to a control knob having an image output part which includes: a head part through which an image is output; a body part into which a portion of the head part is inserted; a guide part disposed inside the body part and coupled to the head part to guide horizontal movement of the head part; and a returning part connected together with the guide part to the head part and guiding the head part having horizontally moved along the guide part to a center of the body part.

The head part may include: a head upper cover disposed to surround a lens; the image output part disposed to face the lens; a head controller sending an image signal to the image output part; a head body on which the head controller is mounted; a head lower cover surrounding the head body and coupled to the head upper cover; and a bearing coupled to the head lower cover and performing rolling motion while adjoining the head body part upon rotation of the head body.

The head controller may include: a head substrate connected to the image output part via an electric wire; a distance sensor provided to the head substrate and measuring a distance between the head lower cover and the head substrate through the head body; and a rotation sensor provided to the head substrate and detecting rotation of the head lower cover rotating around a circumference of the head substrate.

The head lower cover may include a reflective plate disposed on a bottom surface thereof facing the distance sensor and reflecting light from the distance sensor; and a recognition portion disposed along a circumference of the reflective plate and detected by the rotation sensor.

The head body may include: a head frame on which the head controller is mounted; an extension member extending from the head frame and penetrating the head lower cover; and a roughness section including a plurality of grooves formed along a circumference of the extension member and touched by a ball member of the bearing to generate manipulation sound.

The control knob may further include: a main controller coupled to the other side of the body part facing the head part and connected to the head controller to send data.

The control knob may further include: a horizontal movement detection sensor part provided to the main controller and the extension member to detect horizontal movement of the head part.

The horizontal movement detection sensor part may include: a measurement target coupled to the extension member and provided with a permanent magnet; and a Hall sensor provided to the main controller and measuring a magnetic field changed by movement of the permanent magnet.

The control knob may further include: a support member secured to an inner side of the body part; and an elastic deformation member mounted on an upper side of the support member and compressed to generate manipulation sound by downward movement of the head part.

The guide part may include: a stationary panel secured to an inner side of the body part; a movable panel mounted on the stationary panel and reciprocating in one direction; and a cover panel mounted on the movable panel and reciprocating in the other direction perpendicular to the movable panel.

The guide part may include: a first guide protrusion and a first guide groove formed on the stationary panel and the movable panel to guide the movable panel to move in the one direction; and a second guide protrusion and a second guide groove formed on the movable panel and the cover panel to guide the cover panel to move in the other direction.

The returning part may include: an inner ring having an inner through-hole through which the head part passes; an outer ring separated from the inner ring and disposed outside the inner ring; and an elastic member spirally extending from the inner ring and connected to the outer ring.

Advantageous Effects

According to embodiments of the present invention, the control knob having an image output part can receive manipulation force by horizontal movement, vertical movement, and rotational movement, and can output an image through the image output part, thereby improving space utility.

BRIEF DESCRIPTION

Some of the embodiments will be described in detail, with reference to the following figures, wherein like designations denote like members, wherein.

DETAILED DESCRIPTION

Hereinafter, embodiments of the present invention will be described in detail with reference to the accompanying drawings. It should be understood that the drawings are not to precise scale and may be exaggerated in thickness of lines or size of components for descriptive convenience and clarity only.

In addition, the terms used herein are defined by taking functions of embodiments of the present invention into account and can be changed according to user or operator custom or intention. Therefore, definition of the terms should be made according to the overall disclosure set forth herein.

Figure 1:
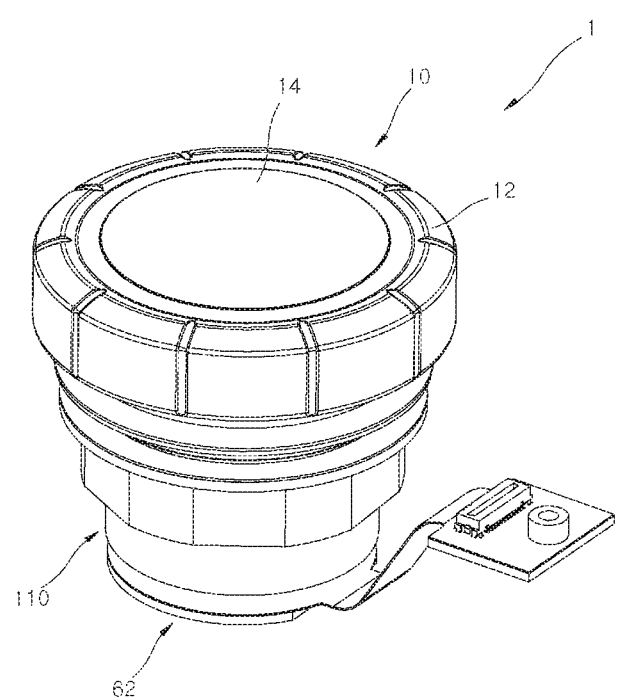
FIG. 1 is a schematic perspective view of a control knob having an image output part.
Figure 2:
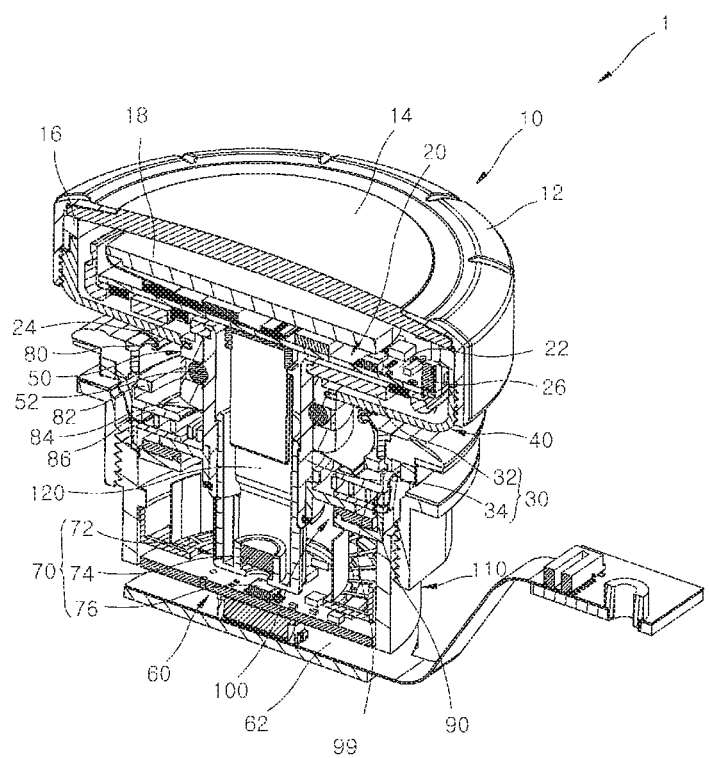
FIG. 2 is a partially cut-away perspective view of the control knob according to the embodiment of the present invention.
Figure 3:
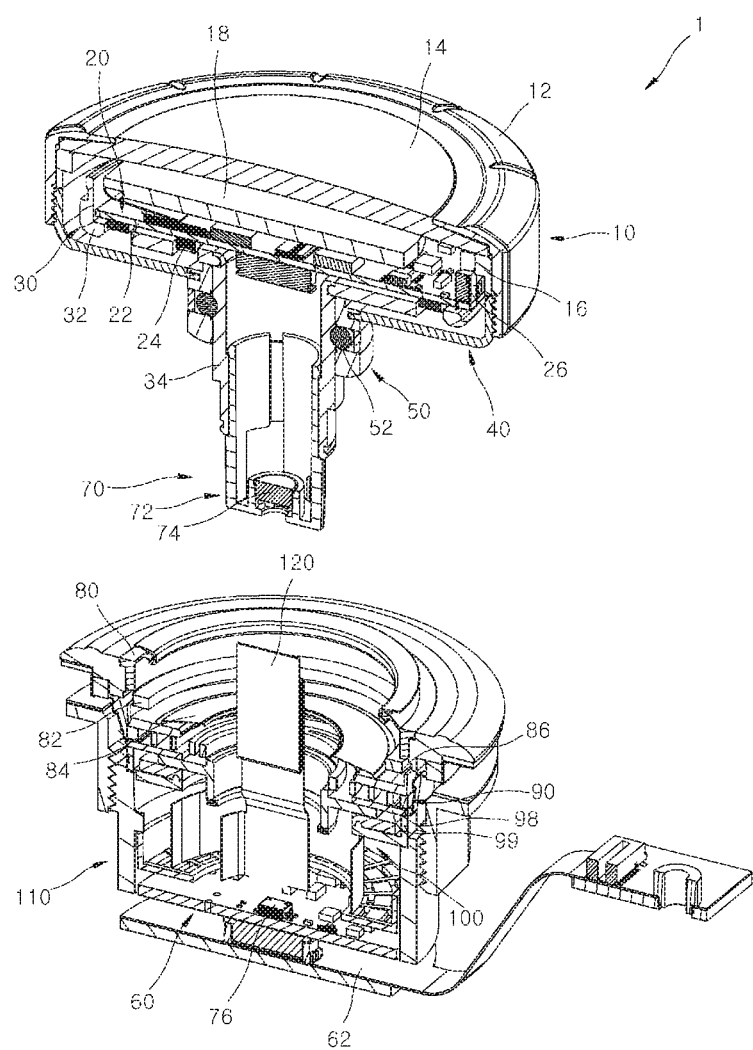
FIG. 3 is an exploded perspective view of the control knob, in which a head part is separated from a body part.
Figure 4:
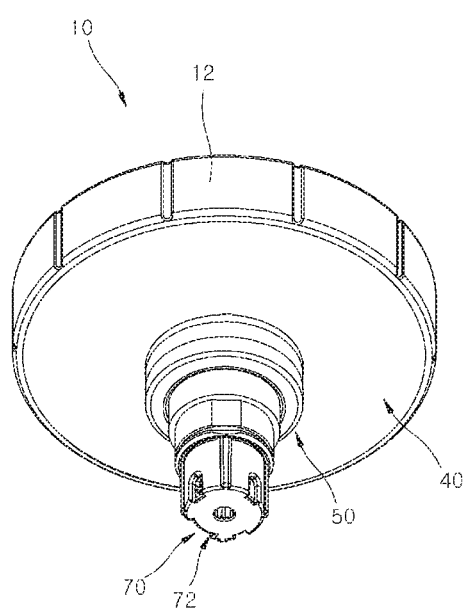
FIG. 4 is a bottom perspective view of the head part.
Figure 5:
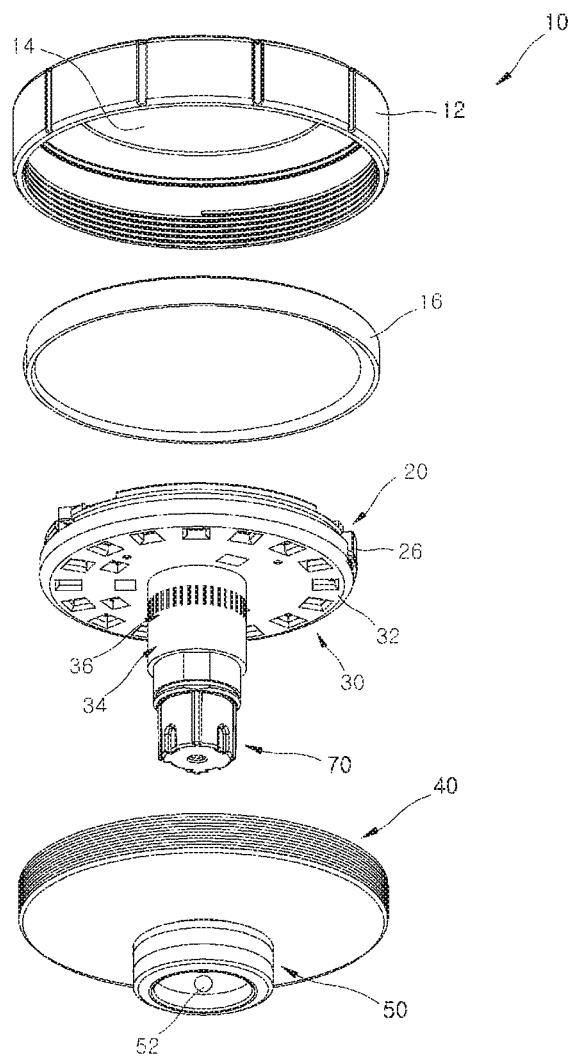
FIG. 5 is an exploded perspective view illustrating main components of the head part of the control knob.
Figure 6:
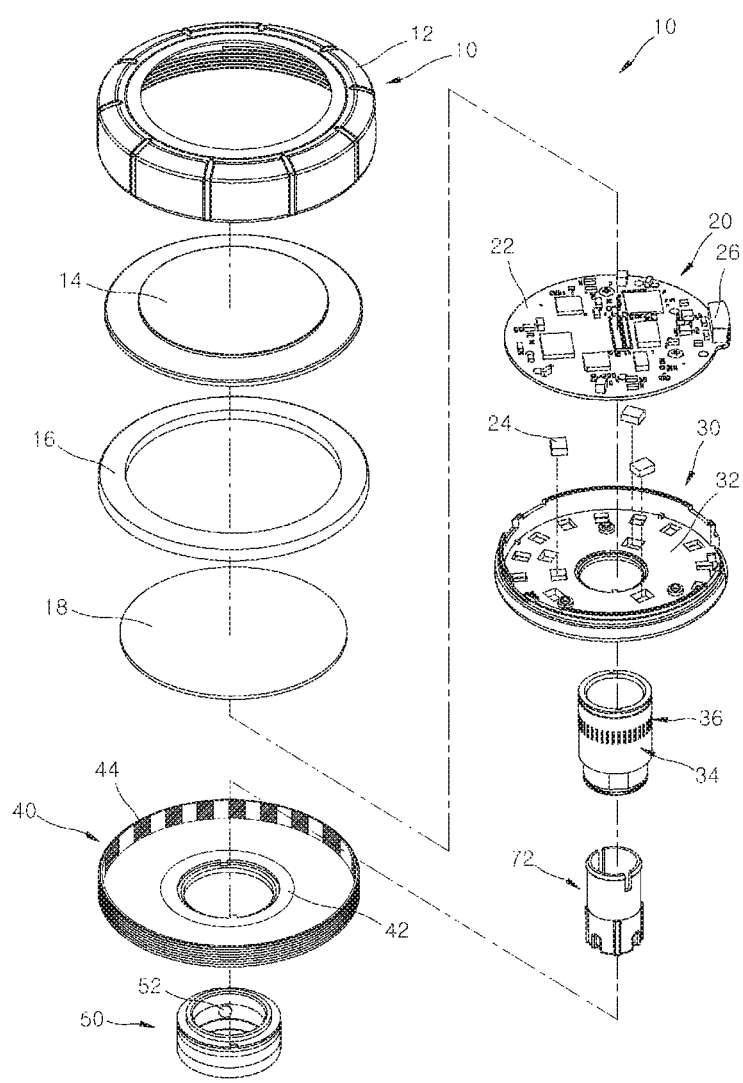
FIG. 6 is an exploded perspective view of the control knob, in which a head body is separated from a head lower cover.
Figure 7:
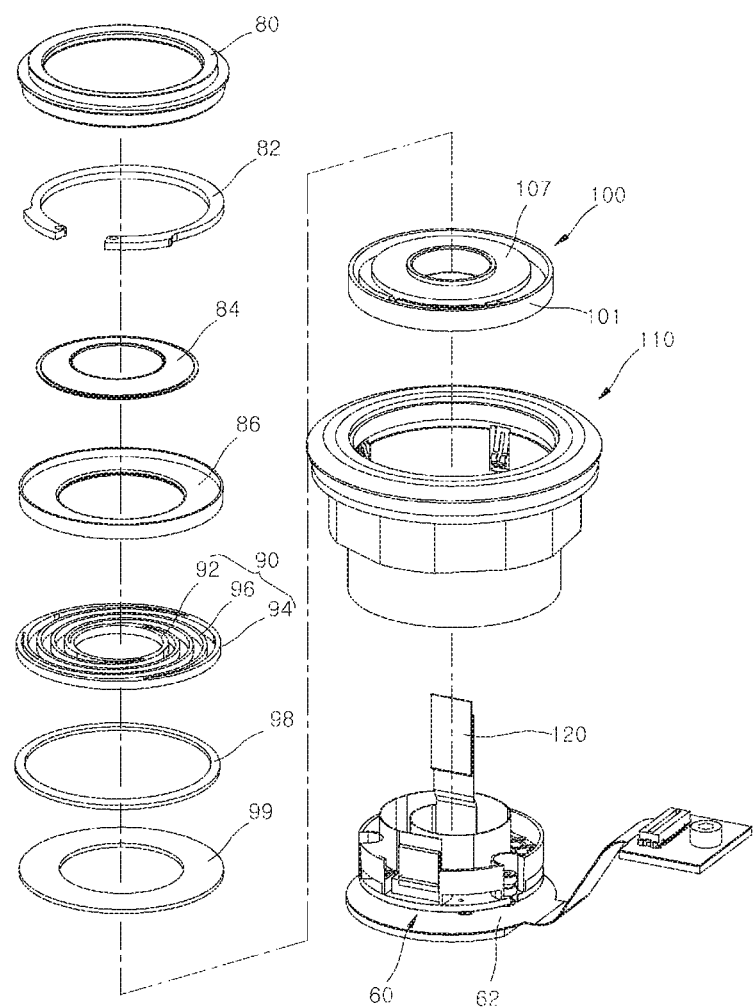
FIG. 7 is an exploded perspective view illustrating main components of a body part of the control knob.
Figure 8:
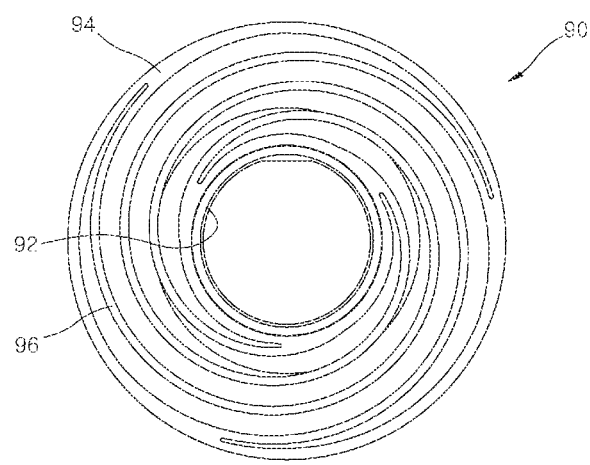
FIG. 8 is a plan view of a returning part of the control knob.
Figure 9:
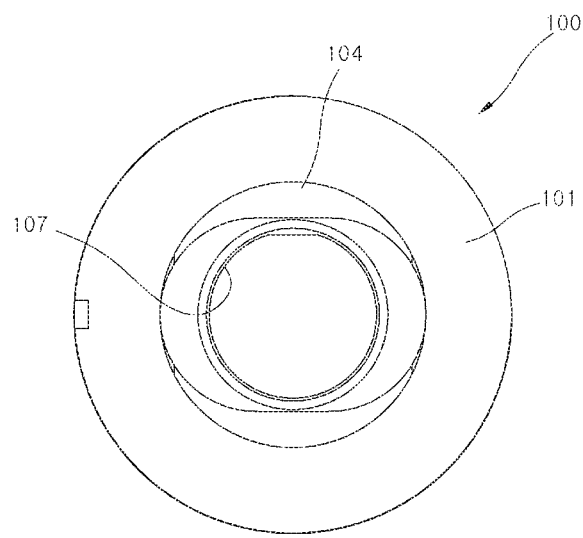
FIG. 9 is a bottom view of a guide part of the control knob.
Figure 10:
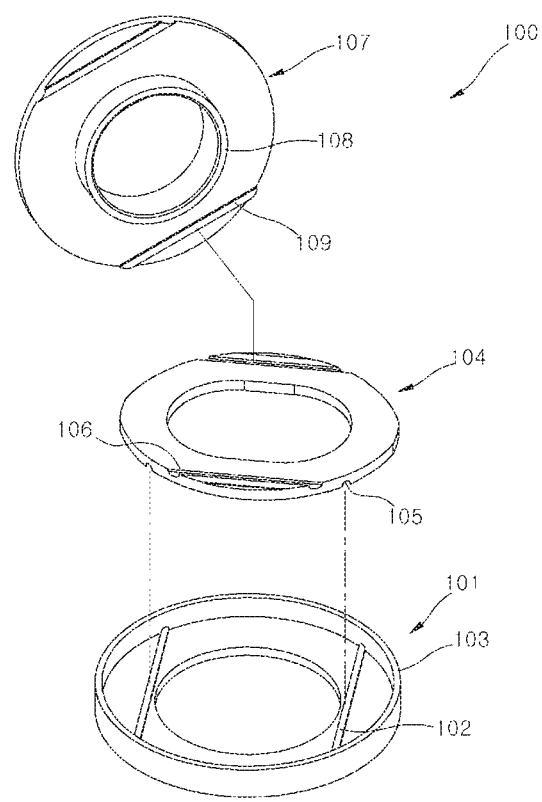
FIG. 10 is an exposed perspective view of the guide part of the control knob.
Figure 11:
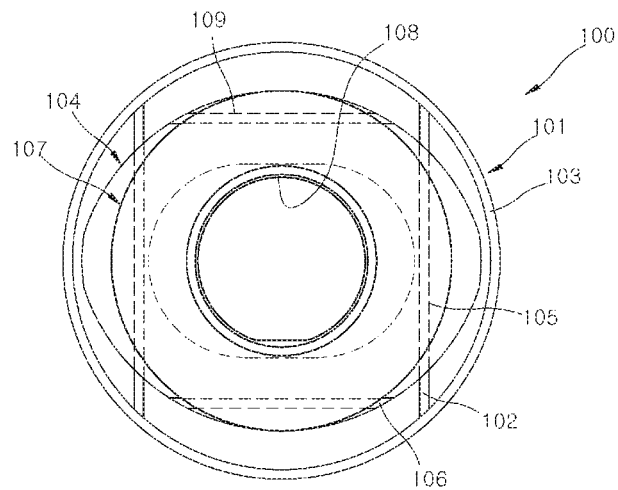
FIG. 11 is a plan view of the guide part of the control knob.
Figure 12:
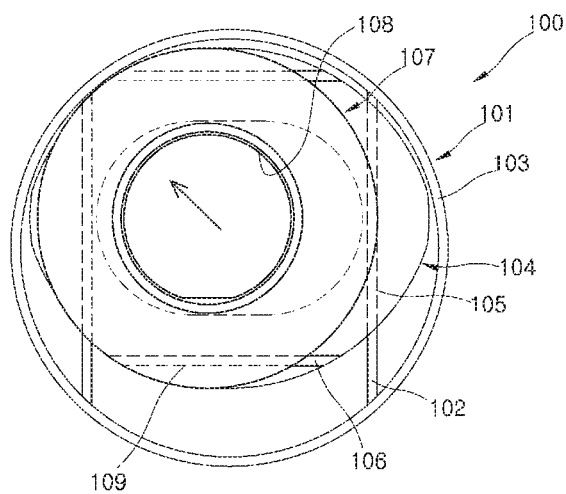
FIG. 12 is a schematic plan view of a cover panel of the control knob, in which the cover panel is horizontally moved in a diagonal direction.

FIG. 1 is a schematic perspective view of a control knob having an image output part according to one embodiment of the present invention; FIG. 2 is a partially cut-away perspective view of the control knob according to the embodiment of the present invention; FIG. 3 is an exploded perspective view of the control knob according to the embodiment of the present invention, in which a head part is separated from a body part; FIG. 4 is a bottom perspective view of the head part; FIG. 5 is an exploded perspective view illustrating main components of the head part of the control knob according to the embodiment of the present invention; FIG. 6 is an exploded perspective view of the control knob according to the embodiment of the present invention, in which a head body is separated from a head lower cover; FIG. 7 is an exploded perspective view illustrating main components of a body part of the control knob according to the embodiment of the present invention; FIG. 8 is a plan view of a returning part of the control knob according to the embodiment of the present invention; FIG. 9 is a bottom view of a guide part of the control knob according to the embodiment of the present invention; FIG. 10 is an exposed perspective view of the guide part of the control knob according to the embodiment of the present invention; FIG. 11 is a plan view of the guide part of the control knob according to the embodiment of the present invention; and FIG. 12 is a schematic plan view of a cover panel of the control knob according to the embodiment of the present invention, in which the cover panel is horizontally moved in a diagonal direction.

Referring to FIG. 1 to FIG. 3, a control knob 1 having an image output part according to one embodiment of the present invention includes a head part 10 through which an image is output; a body part 110 into which a portion of the head part 10 is inserted; a guide part 100 disposed inside the body part 110 and coupled to the head part 10 to guide horizontal movement of the head part 10; and a returning part 90 connected together with the guide part 100 to the head part 10 and guiding the head part 10 having horizontally moved along the guide part 100 to a center of the body part 110.

The head part 10 may have any shape so long as the head part can permit an image to be output therethrough.

Referring to FIG. 2 to FIG. 6, the head part 10 is configured to move in a vertical direction or in a horizontal direction with respect to the body part 110 and is provided at an edge thereof with a head upper cover 12 rotatable about the head part 10.

Such movement of the head part 10 is sensed by a sensor and is sent as a signal to a head controller 20 or a main controller 60.

The head upper cover 12 is placed at an upper side of the head part 10 (hereinafter, see FIG. 3) and is disposed in a ring shape along the edge of the head part 10.

The head upper cover 12 is disposed to surround a lens 14 disposed inside the head upper cover 12.

An image output part 18 is disposed below the lens 14 to face the lens 14, and a weight ring 16 is disposed outside the image output part 18.

The weight ring 16 increases weight of the edge of the head part 10 to increase rotational force of the head part 10.

In order to protect the image output part 18, a rubber packing may be provided to surround an edge of the image output part 18.

The head controller 20 is disposed under the image output part 18 and is connected to the image output part 18, and may be realized by any controller in the related art so long as the controller can send an image signal to the image output part 18.

According to one embodiment, the head controller 20 includes: a head substrate 22 connected to the image output part 18 via an electric wire; distance sensors 24 provided to the head substrate 22 and measuring a distance between the head lower cover 40 and the head substrate 22 through the head body 30; and a rotation sensor 26 provided to the head substrate 22 and detecting rotation of the head lower cover 40 rotating about a circumference of the head substrate 22.

A plurality of electronic components is mounted on the head substrate 22, and the rotation sensor 26 is disposed at an edge of the head substrate 22 and faces the recognition portion 44 disposed at a rim of the head lower cover 40.

According to one embodiment, the recognition portion 44 includes a plurality of black marks arranged at predetermined intervals, and when the recognition portion 44 is rotated together with the head lower cover 40 in a state that the head controller 20 including the rotation sensor 26 is secured, the rotation sensor 26 detects rotation of the recognition portion 44 and sends the detection signal to the head controller 20.

A plurality of distance sensors 24 is disposed under the head substrate 22 and detects a distance between the head lower cover 40 and the distance sensor 24 through the head body 30.

Accordingly, when the head upper cover 12 and the head lower cover 40 are moved upwards or downwards in a state that upward or downward movement of the head controller 20 and the head body 30 is restricted, the distance sensors 24 can measure upward or downward movement of the head part 10 by detecting light reflected by a reflective plate 42 of the head lower cover 40.

The head body 30, on which the head controller 20 is mounted, includes: a head frame 32 on which the head controller 20 is mounted; an extension member 34 extending from the head frame 32 and penetrating the head lower cover 40; and a roughness section 36 including a plurality of grooves along a circumference of the extension member 34 and touched by a ball member 52 of a bearing 50 to generate manipulation sound.

According to one embodiment, the head frame 32 has a circular plate shape and is provided with a plurality of holes through which light emitted from the distance sensors 24 is directed downwards.

The head frame 32 has a hollow inner space and the extension member 34 having an inner space communicating with the hollow inner space of the head frame 32 is secured to a lower side of the head frame 21.

The extension member 34 has a pipe shape and includes the roughness section 36 formed along the circumference of the extension member 34 to generate manipulation sound when touched by the ball member 52 of the bearing 50.

According to one embodiment, the roughness section 36 includes a plurality of grooves formed along the circumference of the extension member 34 and extending in the longitudinal direction of the extension member 34.

The bearing 50 is provided to an outer circumference of the roughness section 36 and is secured to the head lower cover 40. With this structure, when the head lower cover 40 is rotated, the ball member 52 is rotated while adjoining the roughness section 36, thereby generating manipulation feeling and manipulation sound.

Since the extension member 34 protruding from the lower side of the head body 30 is secured to the guide part 100 disposed inside the body part 110, the head body 30, the head controller 20 and the image output part 18 do not move upwards or downwards.

The head controller 20 is provided at a lower side thereof with an LED in a circumferential direction such that light emitted from the LED is transferred downwards through the head frame 32.

The head lower cover 40 surrounding the head body 30 and coupled to the head upper cover 12 includes a reflective plate 42 disposed on a bottom surface thereof facing the distance sensor 24 and reflecting light from the distance sensor 24, and the recognition portion 44 formed along the circumference of the reflective plate 42 and detected by the rotation sensor 26.

The head lower cover 40 is open at an upper side thereof and the rim of the head lower cover 40 protrudes upwards and is coupled to the head upper cover 12.

An inner surface of the rim of the head lower cover 40 is provided with a reflector having a pattern to be detected by the rotation sensor 26.

Since the reflective plate 42 is disposed on the bottom surface of the head lower cover 40 to reflect light emitted from the distance sensor 24, rotation and vertical movement of the head lower cover 40 are detected by the distance sensors 24 and the rotation sensor 26.

The bearing 50 is coupled to a lower side of the head lower cover 40 and provides rolling movement to the head body 30 while adjoining the head body 30 upon rotation of the head body 30.

The main controller 60 is coupled to the other side of the body part 110 (a lower side of the body part 110 in FIG. 3) opposite to the head part 10 and is connected to the head controller 20, and may be realized by any controller in the related art so long as the controller can receive or send data.

A lower portion of the main controller 60 is supported by a controller support 62, and the main controller 60 and an external controller can send control signals through the controller support 62.

A horizontal movement detection sensor part 70 is provided to the main controller 60 and the extension member 34 to detect horizontal movement of the head part 10 and may be realized by any sensor in the related art so long as the sensor can detect horizontal movement of the head part 10.

According to one embodiment, the horizontal movement detection sensor part 70 includes a measurement target 72 coupled to the extension member 34 and including a permanent magnet 74, and a Hall sensor 76 provided to the main controller 60 and measuring a magnetic field changed by movement of the permanent magnet 74.

The measurement target 72 having a cylindrical shape is coupled to a lower side of the extension member 34 and provided at a lower side thereof with the permanent magnet 74.

The Hall sensor 76 is placed below the measurement target 72 to be separated from the measurement target 72 and is coupled to an upper side of the main controller 60.

The Hall sensor 76 detects horizontal movement of the permanent magnet 74 using a magnetic field changed by movement of the permanent magnet 74.

The body part 110 is placed at a lower portion of the head part 10 and has a cylindrical shape, and a mounting ring 80 formed of an elastic material is mounted on an upper side of the body part 110.

The mounting ring 80 may adjoin the lower side of the head lower cover 40 and reduce impact generated due to contact between the head lower cover 40 and the body part 110.

A support member 86 is secured to an inner side of the body part 110 and an elastic deformation member 84 is disposed on an upper side of the support member 86 to be compressed by downward movement of the head part 10.

The elastic deformation member 84 protrudes upwards and is compressed by the head part 10 while contacting the head part 10 to generate manipulation feeling and manipulation sound when the head part 10 is moved downwards.

The extension member 34 is disposed to penetrate the center of the elastic deformation member 84, and when the elastic deformation member 84 is horizontally moved together with the head part 10, the support member 86 supports the elastic deformation member 84 while the elastic deformation member 84 slides.

A snap ring 82 is mounted on an upper side of the support member 86, and holds and prevents members such as the support member 86, the returning part 90 and the guide part 100 mounted inside the body part 110 from being separated outwards from the body part 110.

The returning part 90 disposed at a lower side of the support member 86 is connected together with the guide part 100 to the head part 10 to provide restoration force to guide the head part 10 having horizontally moved along the guide part 100 to the center of the body part 110, and may be realized by any elastic device in the related art so long as the elastic device can provide restoration force.

According to one embodiment, the returning part 90 includes: an inner ring 92 having an inner through-hole through which the head part 10 passes; an outer ring 94 separated from the inner ring 92 and disposed outside the inner ring 92; and an elastic member 96 spirally extending from the inner ring 92 and connected to the outer ring 94.

The inner ring 92 and the outer ring 94 are formed in a ring shape, and the plurality of the elastic member 96 connecting the inner ring 92 to the outer ring 94 are formed in a spiral shape.

Thus, when the extension member 34 penetrating the inner ring 92 is slid in the horizontal direction, the returning part 90 realized by the spiral-shaped springs is deformed and then returned to an original shape to move the extension member 34 of the head part 10 to the center of the body part 110.

The returning part 90 is provided at a lower side thereof with a ring-shaped spacer 98. When the returning part 90 is moved in the vertical direction while being horizontally moved by the head part 10, a partition member 99 maintains a space between the returning part 90 and the partition member 99, thereby relieving impact due to upward or downward movement of the returning part 90.

Referring to FIG. 7 to FIG. 13, the guide part 100 disposed inside the body part 110 is coupled to the head part 10 to guide horizontal movement of the head part 10 and may be realized by any guide device in the related art so long as the guide device can guide horizontal movement of the head part.

The guide part 100 allows only horizontal movement of the head part 10 while restricting upward or downward movement of the head part 10, and components constituting the guide part 100 are coupled to each other in groove and rail shapes.

The extension member 34 is secured to the guide part 100 and the head body 30 with the image output part 18 and the head controller 20 mounted thereon is moved together with the extension member 34, whereby rotation of the image output part 18 adopting an LCD monitor can be prevented.

According to one embodiment, the guide part 100 includes: a stationary panel 101 secured to the inner side of the body part 110; a movable panel 104 mounted on the stationary panel 101 and reciprocating in one direction; a cover panel 107 mounted on the movable panel 104 and reciprocating in the other direction perpendicular to the movable panel 104.

The guide part 100 includes: first guide protrusions 102 and first guide grooves 105 formed on the stationary panel 101 and the movable panel 104 to guide the movable panel 104 to move in the one direction; and second guide protrusions 109 and second guide grooves 106 formed on the movable panel 104 and the cover panel 107 to guide the cover panel 107 to move in the other direction.

The first guide protrusions 102 protrude from an upper side of the stationary panel 101, which is secured to the inner side of the body part 110, in one direction (a vertical direction in FIG. 11) and are disposed at opposite sides of a hollow space of the stationary panel 101, respectively.

An edge of the stationary panel 101 protrudes upwards to form a securing rim 103 and the movable panel 104 is mounted on the upper side of the stationary panel 101.

The movable panel 104 is provided at a lower side thereof with the first guide grooves 105 into which the first guide protrusions 102 are inserted, and the first guide protrusions 102 and the first guide groove 105 are disposed in one direction.

The second guide grooves 106 are formed on an upper side of the movable panel 104 in the other direction.

The second guide grooves 106 are perpendicular to the first guide grooves 105 and are disposed at opposite sides of a hollow space of the movable panel 104.

The cover panel 107 is mounted on the upper side of the movable panel 104, and the second guide protrusions 109 protrude from a lower side of the cover panel 107 to be inserted into the second guide grooves 106, respectively.

The cover panel 107 is provided with a pipe-shaped guide projection 108 formed along the circumference of a hollow space thereof and protruding towards the movable panel 104.

The guide projection 108 is inserted into the hollow space of the movable panel 104, and the extension member 34 of the head part 10 is inserted into and secured to the inner side of the guide projection 108.

The main controller 60 is provided to the lower side of the body part 110 into which a portion of the head part 10 is inserted, and the head controller 20 is disposed at the upper side of the head part 10.

The main controller 60 and the head controller 20 are connected to each other by a harness member 120, which is easily bendable, such that electric power and control signals can be supplied through the harness member 120.

Next, operation of the control knob 1 according to the embodiment of the present invention will be described.

When the head part 10 is pushed in the horizontal direction, the cover panel 107 of the guide part 100 connected to the extension member 34 of the head part 10 is horizontally moved.

When the cover panel 107 is slid in the horizontal direction, the movable panel 104 connected to the cover panel 107 is moved to guide horizontal movement of the cover panel 107.

Since the upper side of the cover panel 107 is restricted by the partition member 99, only horizontal movement of the cover panel 107 is permitted.

When the extension member 34 is horizontally moved, the inner ring 92 of the returning part 90 connected to the extension member 34 is also horizontally moved, so that the elastic member 96 disposed between the inner ring 92 and the outer ring 94 are deformed, thereby generating elastic force.

Since the extension member 34 is returned to the center of the body part 110 by such elastic force, the head part 10 is returned to an initial location.

Since the extension member 34 connected to the head body 30 is secured to the guide part 100 such that upward or downward movement of the extension member 34 is restricted by the guide part 100, only the head lower cover 40 and the bearing 50 connected to the head upper cover 12 are moved downwards when the head upper cover 12 or the lens 14 disposed at the upper side of the head part 10 is compressed downwards.

When the bearing 50 compresses the elastic deformation member 84 in the downward direction, the elastic deformation member 84 is deformed while generating a click sound and manipulation feeling.

Such downward movement of the head lower cover 40 is detected by the distance sensors 24 and sent as a detection signal to the head controller 20.

When the head upper cover 12 is rotated, the head lower cover 40 is rotated therewith, and the recognition portion 44 formed along the inner circumference of the head lower cover 40 is also rotated.

The rotation sensor 26 provided to the head body 30 detects movement of the recognition portion 44 and sends a detection result to a rotation controller.

In addition, the bearing 50 is rotated together with the head lower cover 40 such that the ball member 52 generates a rattling sound and manipulation feeling while touching the roughness section 36 of the extension member 34.

As described above, according to embodiments of the present invention, the control knob can receive manipulation force by horizontal movement, vertical movement and rotation and output an image through the image output part 18, thereby improving space utility.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

The invention claimed is:

1. A control knob having an image output part comprising:
   a head part through which an image is output;
   a body part into which a portion of the head part is inserted;
   a guide part disposed inside the body part and coupled to the head part to guide horizontal movement of the head part; and
   a returning part connected together with the guide part to the head part and guiding the head part having horizontally moved along the guide part to a center of the body part;
   wherein the guide part comprises:
   a stationary panel secured to an inner side of the body part;
   a movable panel mounted on the stationary panel and reciprocating in one direction; and
   a cover panel mounted on the movable panel and reciprocating in the other direction perpendicular to the movable panel.

2. The control knob according to claim 1, wherein the head part comprises:
   a head upper cover disposed to surround a lens;
   the image output part disposed to face the lens;
   a head controller sending an image signal to the image output part;
   a head body on which the head controller is mounted;
   a head lower cover surrounding the head body and coupled to the head upper cover; and
   a bearing coupled to the head lower cover and performing rolling motion while adjoining the head body part upon rotation of the head body.

3. The control knob according to claim 2, wherein the head controller comprises:
   a head substrate connected to the image output part via an electric wire;
   a distance sensor provided to the head substrate and measuring a distance between the head lower cover and the head substrate through the head body; and
   a rotation sensor provided to the head substrate and detecting rotation of the head lower cover rotating around a circumference of the head substrate.

4. The control knob according to claim 3, wherein the head lower cover comprises:
   a reflective plate disposed on a bottom surface thereof facing the distance sensor and reflecting light from the distance sensor; and
   a recognition portion disposed along a circumference of the reflective plate and detected by the rotation sensor.

5. The control knob according to claim 2, wherein the head body comprises:
   a head frame on which the head controller is mounted;
   an extension member extending from the head frame and penetrating the head lower cover; and
   a roughness section including a plurality of grooves formed along a circumference of the extension member and touched by a ball member of the bearing to generate manipulation sound.

6. The control knob according to claim 5, further comprising:
   a main controller coupled to the other side of the body part facing the head part and connected to the head controller to send data.

7. The control knob according to claim 6, further comprising:
   a horizontal movement detection sensor part provided to the main controller and the extension member to detect horizontal movement of the head part.

8. The control knob according to claim 7, wherein the horizontal movement detection sensor part comprises:
   a measurement target coupled to the extension member and provided with a permanent magnet; and
   a Hall sensor provided to the main controller and measuring a magnetic field changed by movement of the permanent magnet.

9. The control knob according to claim 1, further comprising:
   a support member secured to an inner side of the body part; and
   an elastic deformation member mounted on an upper side of the support member and compressed to generate manipulation sound by downward movement of the head part.

10. The control knob according to claim 1, wherein the guide part comprises:
    a first guide protrusion and a first guide groove formed on the stationary panel and the movable panel to guide the movable panel to move in the one direction; and
    a second guide protrusion and a second guide groove formed on the movable panel and the cover panel to guide the cover panel to move in the other direction.

11. The control knob according to claim 1, wherein the returning part comprises:
    an inner ring having an inner through-hole through which the head part passes;

an outer ring separated from the inner ring and disposed outside the inner ring; and
an elastic member spirally extending from the inner ring and connected to the outer ring.

* * * * *